United States Patent [19]
Mushiage et al.

[11] Patent Number: 5,981,978
[45] Date of Patent: Nov. 9, 1999

[54] SUPERLUMINESCENT DIODE AND METHOD FOR MANUFACTURING THE SAME

[75] Inventors: Masato Mushiage; Tatsuo Yamauchi; Yukio Shakuda, all of Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).
This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/671,366

[22] Filed: Jun. 27, 1996

Related U.S. Application Data

[60] Division of application No. 08/394,034, Feb. 24, 1995, Pat. No. 5,574,304, which is a continuation-in-part of application No. 08/119,381, Sep. 13, 1993, abandoned.

[30] Foreign Application Priority Data

| Sep. 14, 1992 | [JP] | Japan | 4-244660 |
| Sep. 14, 1992 | [JP] | Japan | 4-244661 |
| Sep. 14, 1992 | [JP] | Japan | 4-244662 |
| Sep. 14, 1992 | [JP] | Japan | 4-244663 |

[51] Int. Cl.$^6$ ............................... H01L 33/00; H01S 3/19
[52] U.S. Cl. ........................ 257/95; 257/97; 257/79; 372/45
[58] Field of Search ............................ 257/12, 13, 79, 257/80, 84, 85, 94, 95, 96, 97, 431, 461, 466; 372/43, 44, 45, 46, 48, 50

[56] References Cited

U.S. PATENT DOCUMENTS

| 4,329,660 | 5/1982 | Yano et al. | 372/46 |
| 4,694,311 | 9/1987 | Rezek et al. | 257/96 |
| 4,723,252 | 2/1988 | Botez et al. | 372/48 |
| 4,730,331 | 3/1988 | Burnham et al. | 372/50 |
| 4,791,635 | 12/1988 | Schairer et al. | 372/46 |
| 4,903,274 | 2/1990 | Taneya et al. | 372/48 |
| 4,975,752 | 12/1990 | Kashima et al. | 257/84 |
| 5,126,803 | 6/1992 | Hager et al. | 257/94 |

FOREIGN PATENT DOCUMENTS

| 63-90882 | 4/1988 | Japan | 392/43 |
| 2-249283 | 10/1990 | Japan | 257/96 |

*Primary Examiner*—Jerome Jackson, Jr.
*Attorney, Agent, or Firm*—Nikaido Marmelstein Murray & Oram LLP

[57] ABSTRACT

A superluminiscent diode includes: a semiconductor substrate of a first conductivity type lower cladding layer of the first conductivity type is provided on the semiconductor substrate. An active layer is provided on the lower cladding layer. An upper cladding layer of a second conductivity type opposite to the first conductivity type bis provided on the active layer. A current blocking layer of the first conductivity type, buried in the upper cladding layer. The current blocking layer has a stripe-shaped groove serving as a current-injection region. The current-injection region is formed in a manner that is extends from an end face of a chip to the inside of the chip, and has a length shorter than that of the chip. The current blocking layer is made of a material having a band gap energy not greater than that of the active layer and a refractive index not smaller than that of the active layer so that light advancing in the active layer is absorbable.

9 Claims, 13 Drawing Sheets

SUPERLUMINESCENT DIODE AND METHOD FOR MANUFACTURING THE SAME

CROSS-REFERENCE TO RELATED APPLICATIONS

This is a divisional application under 37 CFR 1.60 of pending prior application Ser. No. 08/394,034 filed on Feb. 24, 1995 now allowed, which is a Continuation-In-Part of application Ser. No. 08/119,381 filed on Sep. 13, 1993 now abandoned.

BACKGROUND OF THE INVENTION

The present invention relates to superluminescent diodes (hereinafter referred to as "SLDs") and a method for manufacturing the same. More particularly, it relates to an SLD capable of emitting a high intensity of incoherent light with a small radiation angle, which is useful as a light source for optical fiber gyros, optical sensors, optical disks and the like, and to a method for manufacturing the same.

In an SLD, which emits incoherent light of a large output from an end face of an active layer thereof, it is of great importance that laser oscillation in Fabry-Pérot (FP) mode is restrained. To this end, the following SLD structures have heretofore been proposed:

structure (1) wherein an antireflective (AR) coat 30 is formed on opposite end faces to reduce the reflectance thereby restraining FP mode oscillation (refer to FIG. 15);

structure (2) wherein one half of an active layer is used as an non-excitation region 31 which is adapted to absorb light produced at a current-injection region so as to decrease the reflectance of an end face, thereby restraining FP mode oscillation (refer to FIG. 16); and structure (3) wherein light produced at a current-injection region is total-reflected by an end face using a bent waveguide 32 thereby restraining FP mode oscillation (refer to FIG. 17). In FIGS. 15 to 17, numeral 33 denotes a current-injection region, numeral 30 denotes an antireflective coat, and numeral 31 denotes a non-excitation region.

With the structure (1) having the AR coat on the end face, however, an AR coat having an extremely low reflectance for sufficiently restraining laser oscillation needs to be formed with a good reproducibility. This results in a difficulty in device fabrication.

With the structure (2) having the non-excitation region in one half of the active layer and the structure (3) using the bent waveguide, a light output can hardly be expected from the end face opposite to the end face for outputting light and, hence, automatic power control (APC) is hard to realize. Further, with the structure (2) the non-excitation region needs to be made long to sufficiently restrain FR mode oscillation because the non-excitation region is not provided with a special light-absorbing mechanism. Also with the structure (3), a long waveguide is needed for the bent waveguide. Thus, in either case there arises a problem of increased device size (especially in the longitudinal direction).

SUMMARY OF THE INVENTION

In view of the foregoing circumstances, the present invention aims to provide an SLD in which the drawbacks of the prior art device are overcome. It is, therefore, an object of the present invention to provide an SLD which is capable of outputting light from either end face thereof and of realizing APC with ease, and which has small device length and area and offers a good reproducibility in fabrication while exhibiting performance equivalent to or better than the prior art SLDs. It is another object of the present invention to provide a method for manufacturing such a SLD, which is excellently adaptable for mass production.

According to the present invention, there is provided a superluminescent diode comprising:

a semiconductor substrate of a first conductivity type;

a lower cladding layer of the first conductivity type provided on said semiconductor substrate;

an active layer provided on said lower cladding layer;

an upper cladding layer of a second conductivity type opposite to said first conductivity type provided on said active layer; and a current blocking layer of the first conductivity type buried in said upper cladding layer, said current blocking layer has a stripe-shaped groove serving as a current-injection region, said current-injection region being formed in a manner that it extends from an end face of a chip to the inside of said chip, and has a length shorter than that of said chip; and wherein said current blocking layer is made of a material having a band gap energy not greater than that of said active layer and a refractive index not smaller than that of said active layer so that light advancing in said active layer is absorbable therein.

In the SLD of the present invention, preferably, the distance between the current-blocking layer and the active layer is 0.2 to 0.5 $\mu$m, and the portion of the upper cladding layer which is sandwiched between the current-blocking layer and the active layer has a resistivity of 0.01 to 0.5 $\Omega \cdot$cm.

Preferably, the lower and upper cladding layers are each made of a material having a band gap energy larger than that of the active layer and a refractive index smaller than that of the active layer.

The semiconductor substrate preferably has a recess in said current-noninjection region.

In the SLD of the present invention, the recess in the current-noninjection region is preferably formed in a manner that height of said active layer in said current-noninjection region from underside of said semiconductor substrate is substantially the same as that of said current blocking layer in said current-noninjection region since light can be effectively absorbed in said current-noninjection region.

Preferably, opposite ends of the current-injection region are exposed at the opposite end faces, respectively, of the device, and the current-noninjection region is located on half way of the current-injection region.

Further, the recess in the current-noninjection region preferably comprises a plurality of recesses.

It is preferable that an end face of said chip is covered with low-reflectance coating film and incoherent light is radiated from said end face, so that laser light could not be generated.

According to the present invention, there is also provided a current-blocking-type superluminescent diode of a compond semiconductor wherein an active layer is sandwiched by an upper cladding layer of first conductivity and a lower cladding layer of second conductivity type, each having a band gap energy larger than that of the ative layer and a refractive index smaller than that of the active layer, the superluminescent diode comprising: two current-injection regions each of a stripe groove shape which are provided on opposite end faces, respectively, of a chip; two current-noninjection regions extended from the terminal end of each of said current-injection region; and a current blocking layer formed of a material having a band gap energy not greater than that of the active layer and a refractive index not smaller than that of the active layer so as to absorb light advancing in said active layer in said current-noninjection region, said current blocking layer being provided in said upper cladding layer.

Preferably, the two current-injection regions provided respectively on the opposite end face sides are positioned offset to each other such that the respective stripe-shaped groove axes are not aligned with each other.

It is preferable that a distance between said current blocking layer and said active layer is in the range between 0.2 $\mu$m and 0.5 $\mu$m since light can be effectively absorbed in said current-noninjection region, and could not be oscillated.

The two current-injection regions can be formed in a manner that axes of each stripe of said two current-injection regions are aligned with each other, a region interposed between each terminal ends of said two current-injection regions is a current-noninjection region common to said two current-injection regions.

According to the present invention, there is still also provided a method for manufacturing a superluminescent diode comprising the steps of:

(a) sequentially stacking on a semiconductor substrate of a conductivity type a lower cladding layer of the same conductivity type as that of the semiconductor substrate, an active layer of n-type or p-type conductivity or undoped, a first upper cladding layer of a conductivity type opposite to that of the semiconductor substrate, and a current-blocking layer of the same conductivity type as that of the semiconductor substrate;

(b) forming current-injection regions each of a stripe-shaped groove shape by digging the wafer resulting from the step (a) down to the current-blocking layer with use of a mask having stripe-shaped groove openings arranged lengthwise and crosswise;

(c) sequentially stacking on the wafer formed with the current-injection regions a second upper cladding layer and a cap layer, each being of a conductivity type opposite to that of the semiconductor substrate;

(d) abrading the semiconductor substrate to a predetermined thickness;

(e) forming ohmic electrodes on upper and lower surfaces of the wafer;

(f) cutting the wafer into chips such that each chip includes a rear portion of one of two adjacent current-injection regions and a front portion of the other; and (g) forming a protective film or a coating film of a low-reflectance (or reflection) on opposite end faces, respectively, of each of the chips.

In the above method, the mask for forming the current-injection regions in step (b) may have stripe-shaped groove openings disposed in a staggered arrangement.

In the SLD of the present invention, the current-blocking layer has a band gap energy equal to or smaller than that of the active layer and a refractive index equal to or larger than that of the active layer. By virtue of this feature, light produced by the active layer in the current-injection region is efficiently absorbed by the current-blocking layer in the current-noninjection region. As a result, light can be assuredly absorbed by the non-excitation region having even a short length.

Further, if the distance between the current-blocking layer and the active layer is set to 0.2 to 0.5 $\mu$m and the upper cladding layer existing therebetween is made to have a resistivity of 0.01 to 0.5 $\Omega\cdot$cm, reactive current can be reduced and thereby current can be efficiently supplied to a portion just below the current-injection portion with a decreased light-absorption at the lateral sides. In addition, since the active layer can be formed on a flat substrate, it is possible to manufacture a device of good crystallinity even with a vapor deposition process such as MBE or MOCVD.

With the provision of the recess in the current-noninjection region, the active layer and the current-blocking layer which is present in the current-noninjection region are aligned on substantially the same level, hence, light emitted from the active layer is effectively absorbed by the current-blocking layer. As a result, light can be assuredly absorbed by the non-excitation region even shortened.

In the SLD of the present invention, the current-blocking layer, which serves to absorb light, is disposed so as to separate the current-injection regions from each other. Hence, FP mode oscillation can be sufficiently restrained, while at the same time incoherent light can be emitted from each of the front and rear end faces of the device.

Further, if the two current-injection regions are positioned such that the respective stripe-shaped groove axes thereof are not aligned with each other, the two current-injection stripe-shaped grooves can be used as independent waveguides and thereby a long non-excitation region can be ensured which is exposed at the end face which is not intended to output light. Accordingly, FP mode oscillation can be restrained sufficiently, and incoherent light can be obtained from either of the front or rear end face of the device.

In the method for manufacturing SLD of the present invention, current-injection regions are formed with use of the mask having stripe-shaped groove openings arranged lengthwise and crosswise, and the wafer is cut into chips such that each chip includes a rear portion of one of two adjacent current-injection regions and a front portion of the other. Hence, such cutting does not require so high a positional precision.

DETAILED DESCRIPTION

An SLD and a manufacturing method therefor according to the present invention will now be described in detail with reference to the attached drawings.

Figure 1:
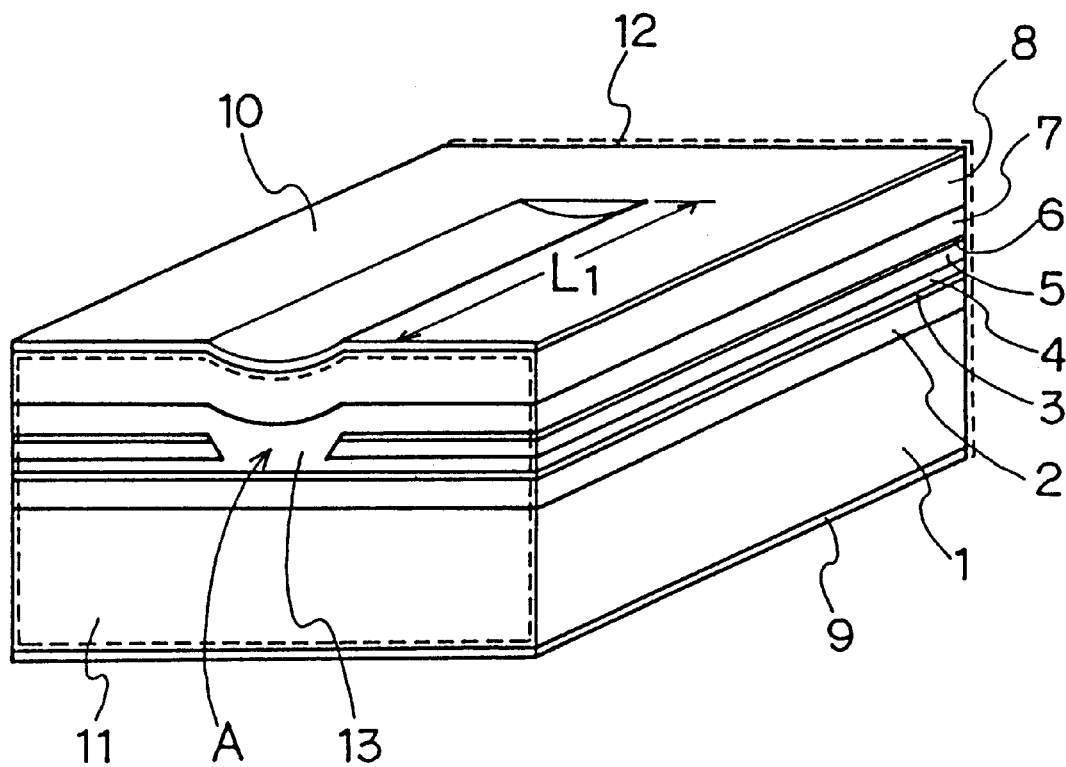
FIG. 1 is an explanatory view showing an SLD manufactured in Example 1 of the present invention.

The SLD of the present invention is formed to have a structure as shown in, for example, FIG. 1. Numeral 1 denotes a semiconductor substrate composed of GaAs of first conductivity type. On the semiconductor substrate 1, there are sequentially formed a lower cladding layer 2 of about 1.0 to about 3.0 $\mu$m thickness composed of $Al_xGa_{1-x}As$ ($0.3 \leq x \leq 0.8$) of the first conductivity type, an active layer 3 of about 0.04 to about 0.2 $\mu$m thickness composed of $Al_yGa_{1-y}As$ ($0 \leq y \leq 0.3$) of first or second conductivity type or undoped, and a first upper cladding layer 4 of about 0.2 to about 0.5 $\mu$m thickness composed of $Al_xGa_{1-x}As$ of the second conductivity type. Further, on the first upper cladding layer 4, there are sequentially formed a current-blocking layer 5 of about 0.2 to 1.0 $\mu$m thickness composed of $Al_zGa_{1-z}As$ ($0 \leq z \leq 0.3$, $z \leq y$) of the first conductivity type, an evaporation-protective layer 6 of about 0.04 to about 0.2 $\mu$m thickness composed of $Al_pGa_{1-p}As$ ($0.1 \leq p \leq 0.8$) of the first conductivity type, a second upper cladding layer 7 of about 1.0 to about 3.0 $\mu$m thickness composed of $Al_xGa_{1-x}As$ of the second conductivity type, and a cap layer 8 of about 0.3 to about 5.0 $\mu$m thickness composed of GaAs of the second conductivity type.

Ohmic electrodes 9 and 10 respectively composed of AuGeNi/Au or the like and Ti/Au or the like are provided on the reverse side of the semiconductor substrate 1 and on the surface of the cap layer 8, respectively. Further, on the front and rear end faces of the SLD shown in FIG. 1, low-reflectance coating films 11 and 12, respectively, each composed of an $Al_2O_3$ film of $\lambda/4$ thickness or a multilayered a-Si film are provided. The provision of the low-reflectance coating films 11 and 12 causes the reflectance of the end faces to decrease from about 30% to about 4% and, if each film is multilayered, the reflectance thereof decreases to less than 1%. As a result, light is repeatedly reflected on both end faces so that light is not oscillated like a laser diode, and incoherent light is radiated from the end faces.

Figure 4:
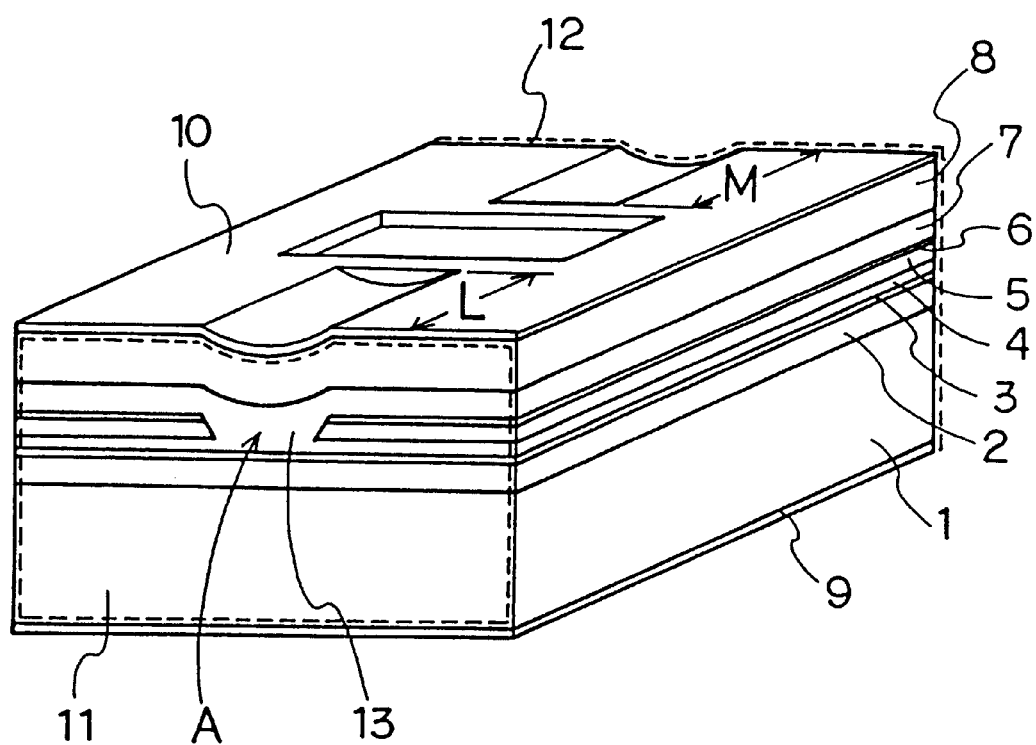
FIG. 4 is an explanatory view showing an SLD manufactured in Example 2 of the present invention.
Figure 10:
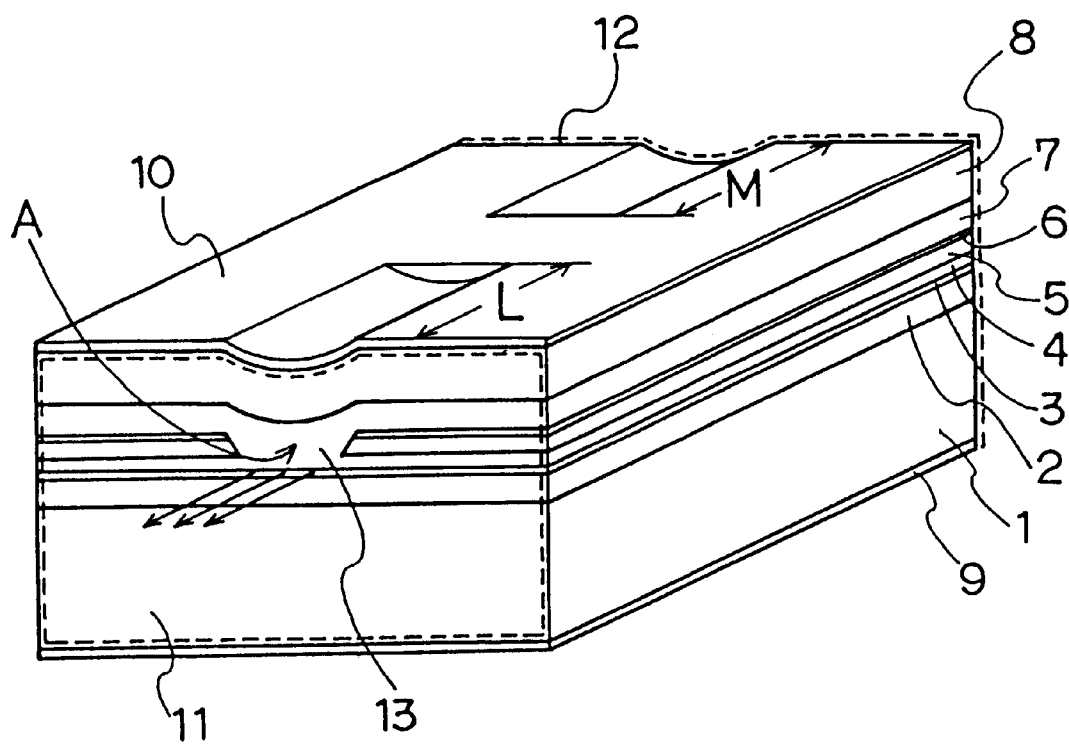
FIG. 10 is an explanatory view showing an SLD manufactured in Example 3 of the present invention.
Figure 12:
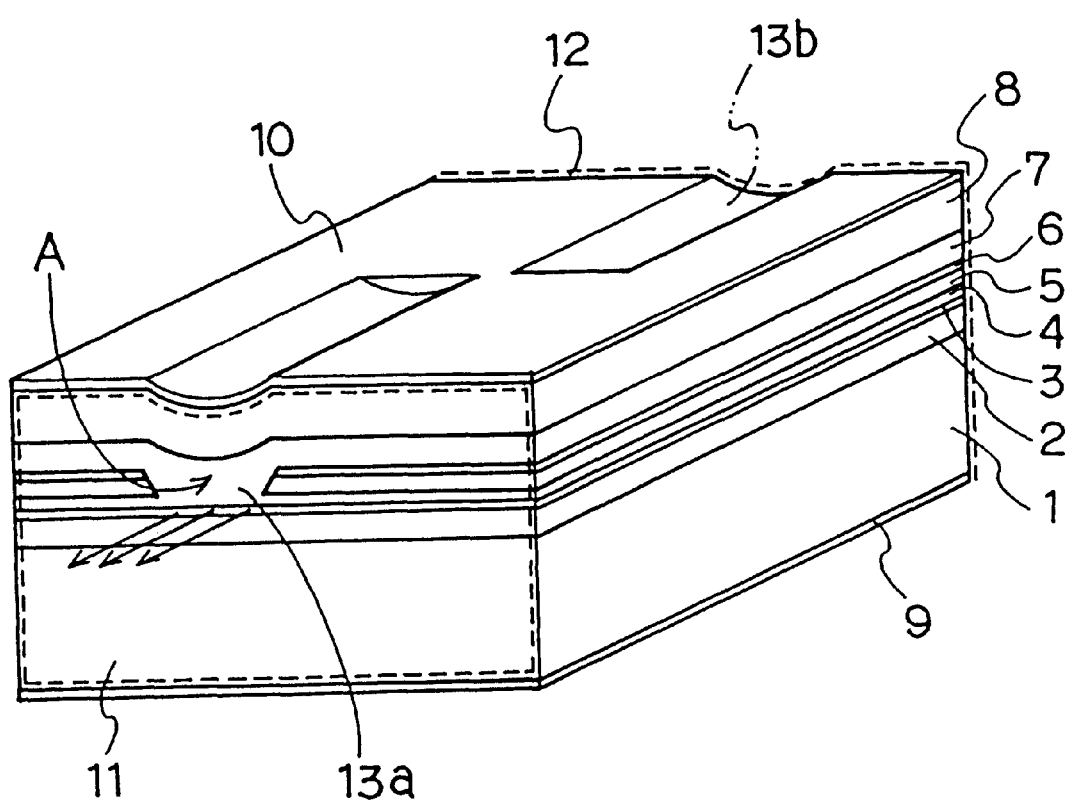
FIG. 12 is an explanatory view showing an SLD manufactured in Example 4 of the present invention.

In the current-blocking layer 5, a stripe-shaped groove forming a current-injection region 13 is formed. This stripe-shaped shape groove, depicted as a difference in level on the substrate surface, does not extend over the entire length of the chip but does extend from the light-emitting end face A as long as a predetermined length $L_1$ with the current-blocking layer 5 completely left in the rest, as shown in FIGS. 1 or 12. Alternatively, as shown in FIGS. 4 or 10, one stripe-shaped groove is formed from the light-emitting end face A to have a predetermined length L and the other one from the rear end face to have a predetermined length M with the current-blocking layer 5 completely left therebetween. This current-blocking layer 5 forms a current-noninjection region which splits the current-injection region 13 into two. In the present embodiment the length L of the stripe-shaped groove extending from the light-emitting end face A is about 100 to about 200 $\mu$m, and the length M of the stripe-shaped groove extending from the rear end face is 0 to about 100 $\mu$m. Herein, the chip size is 250 $\mu$m×250 $\mu$m, and the width of the stripe-shaped grooves is about 3 to about 20 $\mu$m.

The current-blocking layer 5 is present in the upper cladding layer excluding the current-injection region 13. This current-blocking layer 5 is of the same conductivity type as the semiconductor substrate 1 and has a band gap energy equal to or smaller than that of the active layer 3 and a refractive index equal to or larger than that of the active layer 3. By virtue of this feature, the light produced by the active layer 3 underlying the current-injection region 13 and advancing in the direction opposite to the light-emitting end face (i.e. in the direction of the current-noninjection region) penetrates into the current-blocking layer 5, or the non-excitation region with ease, so that the current blocking layer functions as a light absorbing layer to effectively absorb light emitted from the active layer 3. In order to make the current blocking layer 5 function as the light absorbing layer, it is necessary that the current blocking layer is made of a material in which a band gap energy of the current blocking layer is smaller than that of the active layer 3, provided in the neighborhood of the current blocking layer as mentioned above.

Where $Al_qGa_{1-q}As$ is used for both the current-blocking layer 5 and the active layer 3, when the value q is small, the band gap energy thereof is small while the refractive index thereof is large, and as the value q grows larger, the band gap energy thereof becomes larger while the refractive index becomes smaller. Therefore, if the value q for the current-blocking layer is smaller than that for the active layer, the aforementioned relation between them can be realized.

Preferably, the active layer 3 is sandwiched between the first upper cladding layer 4 and the lower cladding layer 2 each having a band gap energy larger than that of the active layer 3 and a refractive index smaller than that of the active layer 3 thereby forming an SLD of current-blocking type.

Further, preferably, the distance between the current-blocking layer 5 and the active layer 3 is set to about 0.2 to about 0.5 $\mu$m while the resistivity of the first upper cladding layer sandwiched therebetween is set to 0.01 to 0.59 $\Omega \cdot$cm, so that current is supplied to a portion just below the current-injection region effectively with lessened reactive current, and the light advancing in the side of the current-noninjection region where stripe-shaped groove is not formed is effectively absorbed.

The first conductivity type herein termed is n-type or p-type conductivity, and the second conductivity type is opposite thereto. Although GaAs is used for the substrate in this embodiment, the substrate may be composed of InP, ZnSe or the like. The film to be grown on the substrate may be composed of an AlGaInP-type material, InGaAsP-type material, ZnCdSSe-type materal or a like material, as well as of the AlGaAs-type material. Further, although the stripe-shaped groove is of a groove form in the present embodiment, it may be of another form.

To be described next with reference to FIG. 2 is an example of the SLD manufacturing method of the present invention, which employs the MBE process.

Figure 2A:
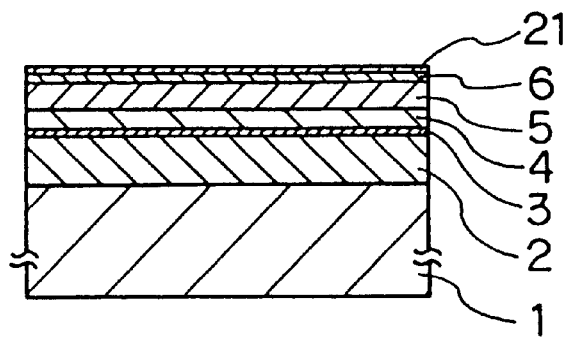
FIGS. 2(a)–2(d) are an explanatory view for illustrating one example of a manufacturing procedure according to a method for manufacturing SLD of the present invention.

Referring to FIG. 2(a), first, on a GaAs semiconductor substrate 1 of the first conductivity type, there are sequentially formed a lower cladding layer 2 of about 1.0 to about 3.0 μm thickness composed of $Al_xGa_{1-x}As$ ($0.3 \leq x \leq 0.8$) of the first conductivity type, an active layer 3 of about 0.04 to about 0.2 μm thickness composed of $Al_yGa_{1-y}As$ ($0 \leq y \leq 0.3$) of first or second conductivity type or undoped, a first upper cladding layer 4 of about 0.2 to about 0.5 μm thickness composed of $Al_xGa_{1-x}As$ of the second conductivity type, a current-blocking layer 5 of about 0.2 to 1.0 μm thickness composed of GaAs of first conductivity type, an evaporation-protective layer 6 of about 0.04 to about 0.2 μm thickness composed of $Al_pGa_{1-p}As$ ($0.1 \leq p \leq 0.8$) of the first conductivity type, and a surface-protective layer 21 of about 0.04 to about 0.2 μm thickness composed of GaAs of the first or second conductivity type or undoped. In forming these layers the distance between the current-blocking layer 5 and the active layer 3 is set to about 0.2 to about 0.5 μm while setting the resistivity of the first upper cladding layer 4 to 0.01 to 0.5 Ω·cm.

In the present invention the current-blocking layer 5 is adapted to have a band gap energy equal to or smaller than that of the active layer 3 and a refractive index equal to or larger than that of the active layer 3.

Figure 2B:
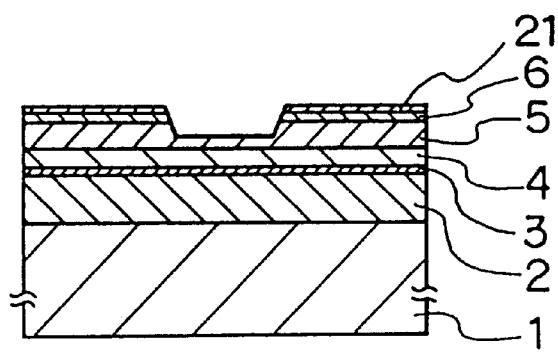

Referring to FIG. 2(b), next, the wafer thus formed is subjected to chemical etching with use of a mask having stripe-shaped groove openings arranged lengthwise and crosswise, thereby digging stripe-shaped grooves each having a width of about 6 μm in the surface of the wafer down to the current-blocking layer 5. In this case, the lower portion of the current-blocking layer 5 is retained as thick as about 0.1 μm so as to prevent oxidation of the cladding layer containing Al due to exposition to air, which will be removed by evaporation utilizing the difference in evaporation rate in the subsequent step.

Figure 2C:
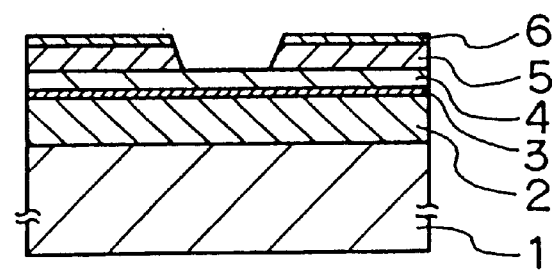

Referring to FIG. 2(c), in turn, the wafer thus treated is placed in the MBE (Molecular Beam Epitaxy) apparatus again, and then only the GaAs is selectively evaporated utilizing the difference in evaporation rate between GaAs and AlGaAs. This thermal etching process is carried out at about 760° C. for about 10 minutes. The evaporation rate of GaAs at 760° C. is 1.2 μm/h while in contrast that of $Al_{0.15}Ga_{0.85}As$ at the same temperature is 0.01 μm/h. Hence, only GaAs is selectively evaporated. By this process a clean cladding layer appears with its surface not oxidized.

Figure 2D:
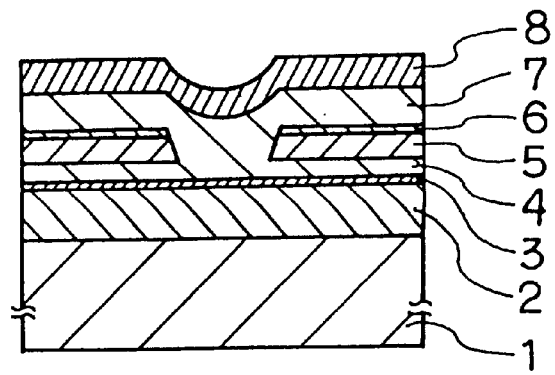

Referring to FIG. 2(d), subsequently, on the wafer cooled to 580° C. a second upper cladding layer 7 of 1.0 to 3.0 μm thickness composed of $Al_xGa_{1-x}As$ of the second conductivity type, and a cap layer 8 of 0.3 to 5.0 μm thickness composed of $p^+$-GaAs are stacked.

As described above, the wafer fabrication process is completed with the masking process conducted only once and the epitaxy process only twice. The wafer thus fabricated is lapped at the side of n-GaAs substrate 1 as thin as about 60 μm. Then, on the upper and lower faces of the wafer, AuGeNi/Au or the like and Ti/Au or the like, respectively are deposited, to form ohmic electrodes 9 and 10. Further, the wafer is cut into chips, and low-reflectance coating films 11 and 12 made of $Al_2O_3$ or a-Si are formed on opposite end faces, respectively, of each chip. Note that the wafer is cut into chips so that each chip will include the rear portion of one of two adjacent current-injection regions and the front portion of the other, such current-injection region having been formed with use of the mask having stripe-shaped groove openings arranged lengthwise and crosswise. This does not require so high a positional precision and, thus, the present invention is highly adaptable for mass production.

In the embodiment described above, the MBE process is used for crystal growth. As the method for crystal growth, however, there may he employed MOVPE (Metal Organic Vapor Phase Epitaxy) process, MOMBE process or a like process as well as the MBE (Metal Organic Molecular Beam Epitaxy) process.

Further, in the above embodiment, the retained current-blocking layer is etched completely by the thermal etching. If the thermal etching process is not conducted, there would he no need to form the evaporation-protective layer 6 or the surface-protective layer 21.

EXAMPLE 1

First, on a semiconductor substrate 1, there were sequentially stacked a lower cladding layer 2 of 1.5 μm thickness composed of $n-Al_{0.6}Ga_{0.4}As$, an active layer 3 of 0.08 μm thickness composed of undoped $Al_{0.05}Ga_{0.95}As$, a first upper cladding layer 4 of 0.4 μm thickness composed of $p-Al_{0.6}Ga_{0.4}As$, a current-blocking layer 5 of 0.3 μm thickness composed of n-GaAs, an evaporation-protective layer 6 of 0.07 μm thickness composed of $n-Al_{0.15}Ga_{0.85}As$, and a surface-protective layer 21 of 0.04 μm thickness composed of undoped GaAs (refer to FIG. 2(a)). In this case, in order to effectively absorb light advancing in the active layer in the current-noninjection region, the distance between the current-blocking layer 5 and the active layer 3 was set to about 0.2 to about 0.5 μm, while the resistivity of the first upper cladding layer 4 was set to 0.01 to 0.5 Ω·cm.

In the present invention, further in order to effectively absorb the light leaking from the active layer and another light in the current-noninjection region, the current-blocking layer 5 is formed of a material having a band gap energy equal to or smaller than that of the active layer 3 and a refractive index equal to or larger than that of the active layer 3. Where $Al_qGa_{1-q}As$ is used for both the current-blocking layer 3 and the active layer 3, when the value q is small, the band gap energy thereof is small while the refractive index thereof is large, and as the value q grows larger, the band gap energy thereof becomes larger while the refractive index becomes smaller. Therefore, if the value q for the current-blocking layer is set smaller than that for the active layer, the aforementioned relation between them can be realized.

Figure 3:
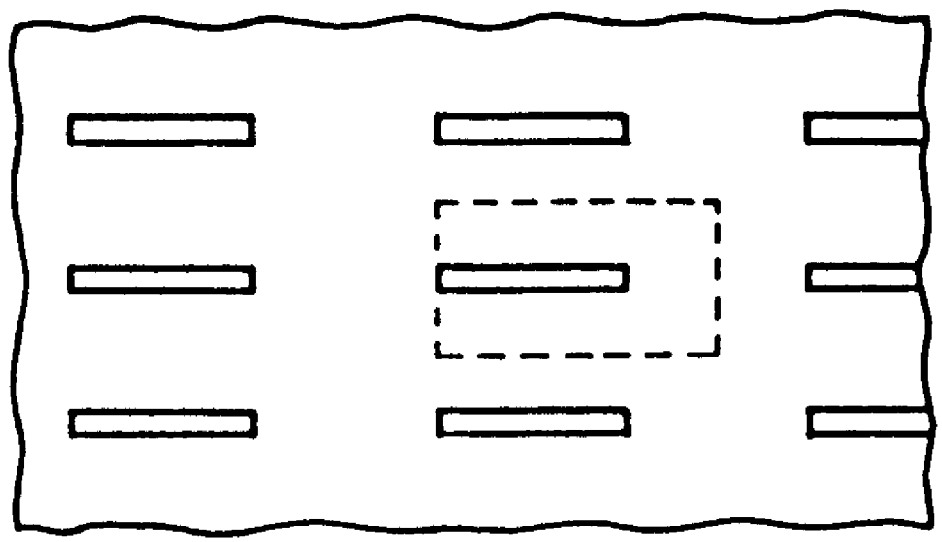
FIG. 3 is a fragmentary plan view of a mask for use in manufacturing the SLD of Example 1 of the present invention.

Next, a stripe-shaped groove for forming a current-injection region 13 was formed in the current blocking layer 5 from one of said end faces with use of a mask as shown in FIG. 3, said stripe-shaped groove having a length $L_1$ smaller than a length of the chip (referring to FIG. 1) followed by a heat treatment, as described above. Thereafter, on the wafer by a second crystal growth process, a second upper cladding layer 7 of about 1.2 μm thickness composed of $p-Al_{0.6}Ga_{0.4}As$ were stacked, and a cap layer 8 of about 1.2 μm thickness composed of $p^+$-GaAs were stacked. Finally, the wafer was cut into chips to form SLDs by the foregoing method. The current-noninjection region without having any region where electric current is injected is extended from the terminal end of the stripe-shaped groove. As a result, the current blocking layer 5 is buried in the upper cladding layers 4, 7 so that only the current-injection region 13 is removed. For that reason, when the SLD is operated, electric current is prevented from flowing other than the current-noninjection region 13 by the current blocking layer 5, so that electric current is flown in the active layer 3 only in the current-injection region 13, the light is emitted in the active layer under the current-injection region 13, and the light is advanced in the active layer 3.

In the SLD manufactured in Example 1, the non-excitation region (current-noninjection region) has a function of absorbing light effectively. Hence, that region may have a decreased length, contributing to a decreased device size (especially in length).

EXAMPLE 2

An SLD in this Example is characterized in that two current-injection regions are formed to extend from the opposite end faces, respectively, of the device and a rectangular recess having a depth of 0.2 to 0.5 $\mu$m was formed in the current-noninjection region of the semiconductor substrate 1 which is located between the two current-injection regions thereof. Other features of this SLD are the same with the SLD of Example 1.

Figure 5:
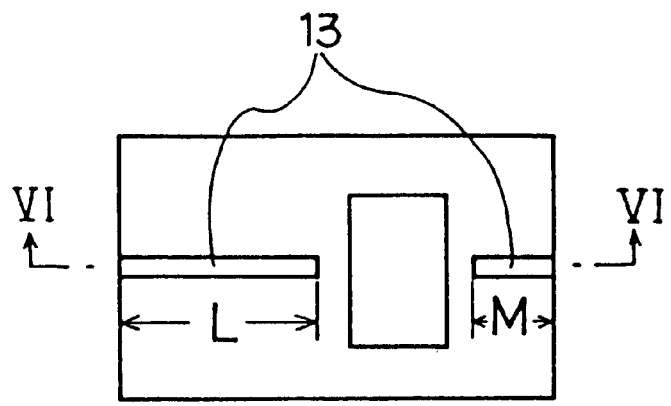
FIG. 5 is a plan view showing the SLD chip of Example 2 of the present invention.
Figure 6:
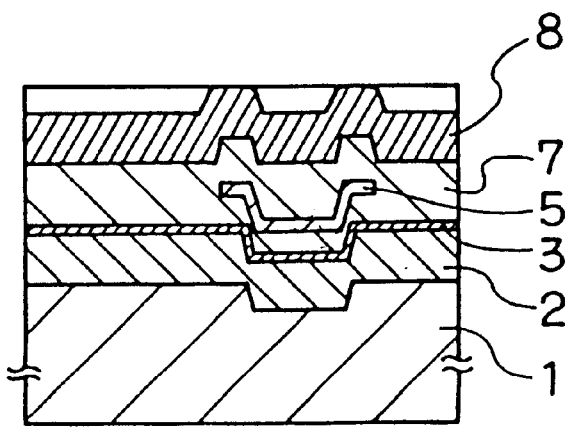
FIG. 6 is a sectional view taken along line VI–VI of FIG. 5.

In the current-blocking layer 5, stripe-shaped grooves forming the current-injection regions 13 are formed. These stripe-shaped grooves, as depicted as differences in level in the surface of the substrate or as understood from the plan view of FIG. 5, do not extend over the entire length of the chip but do extend from the light-emitting end face A as long as a predetermined length L and from the rear end face as far as a predetermined length M, respectively, with the current-blocking layer 5 retained therebetween. The current-blocking layer 5 thus retained forms a current-noninjection region. In this Example, a recess is previously formed in a region of the semiconductor substrate which is coincident with this current-noninjection region. For that reason, the active layer 3 in the current-injection regions and the current-blocking layer 5 in the current-noninjection region are aligned on substantially the same level, as shown in FIG. 6 which is a section taken along a line VI—VI of FIG. 5. In this Example, the length L of the stripe-shaped groove extending from the light-emitting end face A was 100 to 180 $\mu$m, and the length M of the stripe-shaped groove extending from the rear end face was 30 to 100 $\mu$m. Further, the chip size was 250 $\mu$m×250 $\mu$m, and the width of the stripe-shaped grooves was about 3 to about 20 $\mu$m.

The current-blocking layer 5 is provided in the upper cladding layer lying in a region other than the current-injection region 13, and light is produced only by the active layer which is just under the current-injection region 13. This current-blocking layer 5 is of the same conductivity type with the semiconductor substrate 1 and has a band gap energy equal to or smaller than that of the active layer 3 and a refractive index equal to or larger than that of the active layer. By virtue of this, light emitted from the active layer 3 underlying the current-injection region 13 and advancing in the direction opposite to the light-emitting end face A will penetrate into the current-blocking layer 5 with ease. In this Example in particular, a recess is formed in the current-noninjection region, and the active layer 3 in the current-injection regions and the current-blocking layer 5 in the current-noninjection region are made to be aligned on substantially the same level. Hence, light emitted from the active layer 3 can be absorbed more effectively. In this example, the meanings in which the height of the active layer 3 is substantially the same as that of the current blocking layer 5 is the relation of the position in which almost all the light advancing in the active layer in the side of the current-noninjection region directed to the stripe is entered into the current blocking layer 5, said light straightly advancing.

Figure 7:
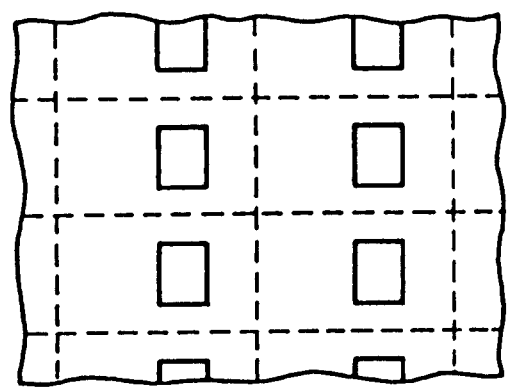
FIG. 7 is a fragmentary plan view showing an example of a mask for substrate etching as used in manufacturing the SLD of Example 2 of the present invention.

In manufacturing the SLD of Example 2, the semiconductor substrate 1 of n-GaAs is first etched to form the rectangular recess of 0.4 $\mu$m depth with use of a mask as shown in FIG. 7 wherein dotted line depicts the shape of each SLD chip. On the surface of the thus etched semiconductor substrate 1, the semiconductor layers in substantially the same manner as in Example 1 are formed.

Figure 8:
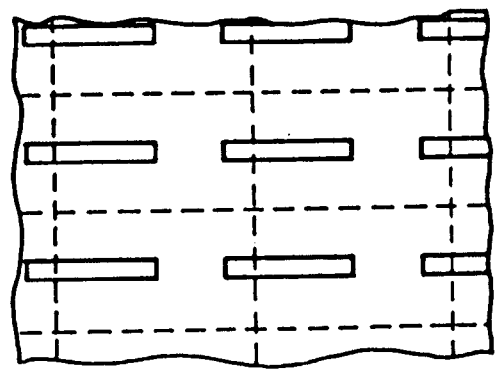
FIG. 8 is a fragmentary plan view showing an example of a mask for forming current-injection regions as used in manufacturing the SLD of Example 2 of the present invention.

In turn, with use of a mask as shown in FIG. 8, a stripe-shaped groove of about 6 $\mu$m width is removed in the wafer resulting from the aforementioned first crystal growth process down to the current-blocking layer 5 by chemical etching (refer to FIG. 2). This etching and the subsequent fabrication step were carried out in the same manner as in Example 1.

Figure 9:
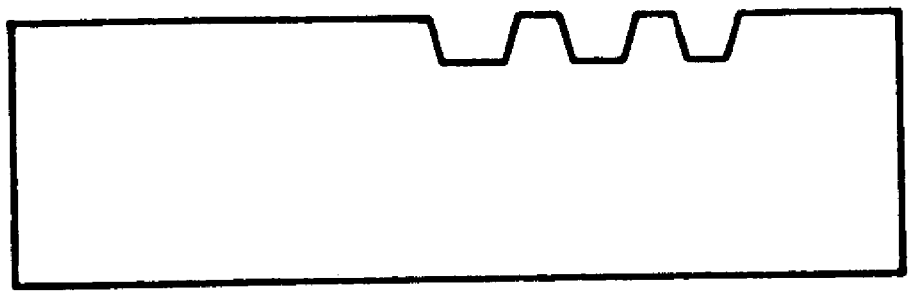
FIG. 9 is an explanatory section showing a semiconductor substrate formed with a plurality of recesses.

In this Example, only one recess is formed in the current-noninjection region. The provision of a plurality of recesses therein as shown in FIG. 9 would cause light to be scattered, thereby restraining FP mode oscillation further.

EXAMPLE 3

An SLD of this Example, as shown in the perspective view thereof at FIG. 10, is characterized in that a stripe-shaped groove serving as the current-injection region 13 is not formed over the entire length of the device but two stripe-shaped grooves extend as long as a predetermined length L from the light-emitting end face A and as long as a predetermined length M from the rear end face, respectively, with the current blocking layer 5 left therebetween. Thus, the current-blocking layer 5 retained, serving as the current-noninjection region, splits the current-injection region 13 into two. In this Example the length L of the stripe-shaped groove extending from the light-emitting end face A was 100 to 180 $\mu$m, and the length M of the other stripe-shaped groove extending from the rear end face was 30 to 100 $\mu$m. The chip size was 250 $\mu$m×250 $\mu$m, and the width of the stripe-shaped grooves was 3 to 20 $\mu$m.

Figure 11:
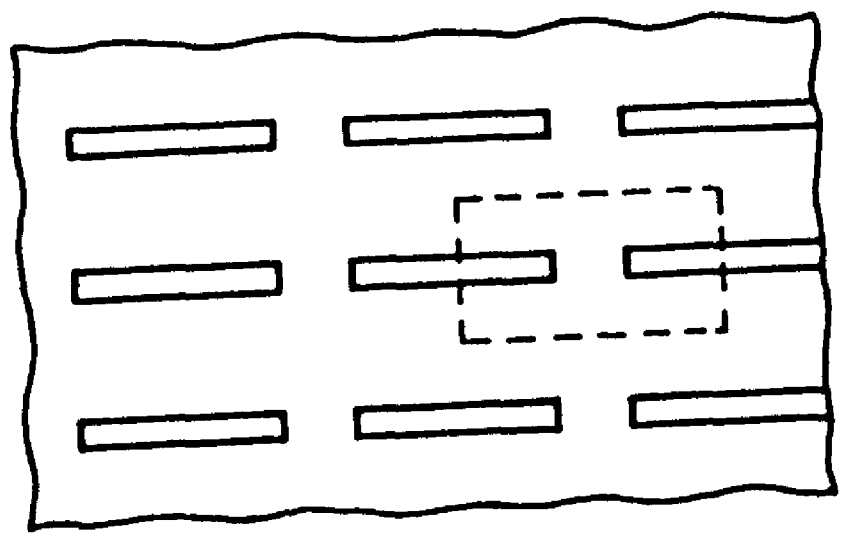
FIG. 11 is a fragmentary plan view of a mask as used in manufacturing the SLD of Example 3 of the present invention.

The SLD of this Example was manufactured in a manner similar to the manufacturing method shown in Example 1. In this Example, a mask as shown in FIG. 11 is used in forming the current-injection region 13 by etching the current-blocking layer 5. This mask is of such a structure as to allow cutting to the wafer at a position on half way of each stripe-shaped groove along the cutting line indicated by dotted line in FIG. 11. Therefore, the stripe-shaped grooves are exposed at the opposite end faces, respectively. As a result, light is also radiated from the rear end face, which allows monitoring on the emitted light quantity. Further, even if the cutting position deviates a little from the predetermined position, devices of constant performance can be obtained with ease.

It should be noted that if the ratio of a light output from the front end face to that from the rear end face is to be changed, only to do is to change the cutting position.

Although the SLD of Example 3 is of a current-blocking structure wherein the lower cladding layer, active layer and upper cladding layer are stacked on the semiconductor substrate, and the cladding layer is composed of a semiconductor having a band gap energy larger than that of a semiconductor forming the active layer and a refractive index smaller than that of the active layer. However, there is no limitation to the structure of this SLD as far as it is a current-blocking structure. The present invention can also be applied to SLDs of the type having a current-blocking layer located adjacent the substrate or a current-blocking layer formed by ion implantation, or of the ridge waveguide type.

EXAMPLE 4

An SLD of this Example, as shown in the explanatory view at FIG. 12, is characterized in that current-injection regions 13a and 13b are disposed offset to each other so that the stripe-shaped groove axes thereof would not be aligned with each other. Other features of this SLD were the same with the SLD of Example 1.

Current-injection stripe-shaped grooves 13a and 13b forming current-injection regions are formed in the current-blocking layer 5. They are, as appearing as difference on the substrate surface or as shown in the plan view at FIG. 14, disposed offset to each other, or not aligned on a straight line while one ends thereof are exposed at the opposite end faces, respectively, of the SLD chip. As a result, light produced under one of the stripe-shaped grooves is hardly waveguided by the other. These current-injection stripe-shaped grooves 13a and 13b may be formed to have the same length so as to utilize emission of light from either end face, or to have different lengths; one is long and the other is short. The SLD with the former feature is advantageous in use because light is emitted in either direction and, hence, there is not required to take so much care to the position of the SLD. The SLD with the latter feature is useful when a large light output is needed. In either case, the current-injection stripe-shaped groove terminate to be exposed at respective end faces and, hence, the SLD can be made small and is convenient when light from the rear end face is used as monitor light. Further, since it is possible to cut or cleave the wafer into chips at a position on halfway of the stripe-shaped groove along the dotted line shown in FIG. 13, there is no need to align the edge of the stripe-shaped groove with the cutting line thereby obtaining SLDs of constant performance with ease. Still further, since the curret-injection regions are not aligned on a straight line, a small-sized SLD can be constructed with a relatively long current-injection region as a whole. In this Example, the SLD was sized 250 $\mu$m×250 $\mu$m with the current-injection stripe-shaped grooves 13a and 13b being each 125$\mu$m long and 6 $\mu$m wide and spaced 1 $\mu$m.

Figure 13:
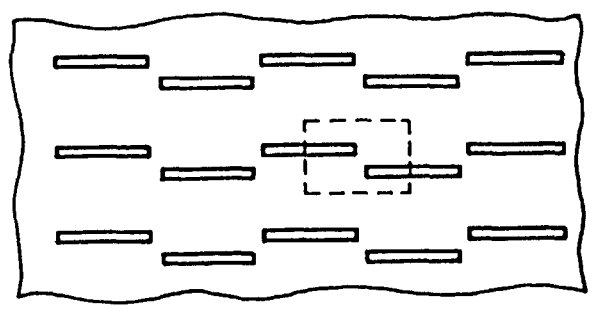
FIG. 13 is a fragmentary plan view of a mask as used in manufacturing the SLD of Example 4 of the present invention.
Figure 14:
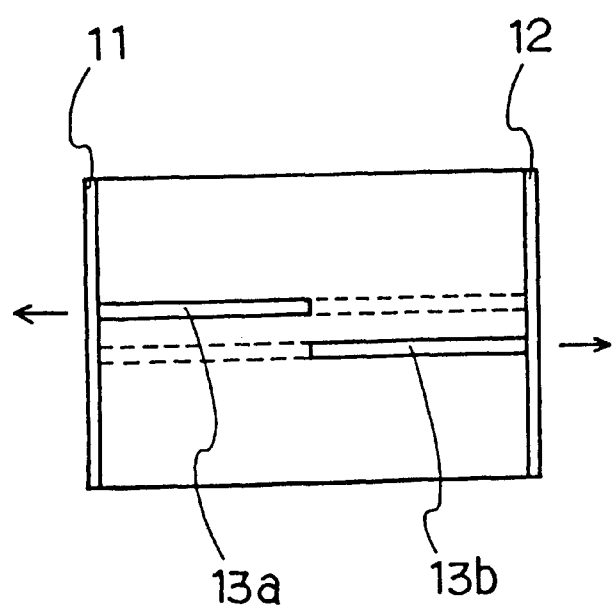
FIG. 14 is a fragmentary plan view showing a current-injection stripe-shaped grooves in the SLD of Example 4 of the present invention.
Figure 15:
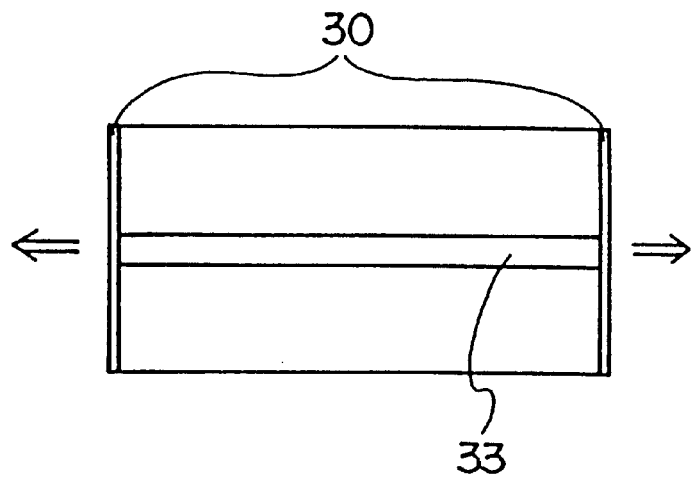
FIGS. 15 to 17 are each an explanatory section showing a conventional SLD.
Figure 16:
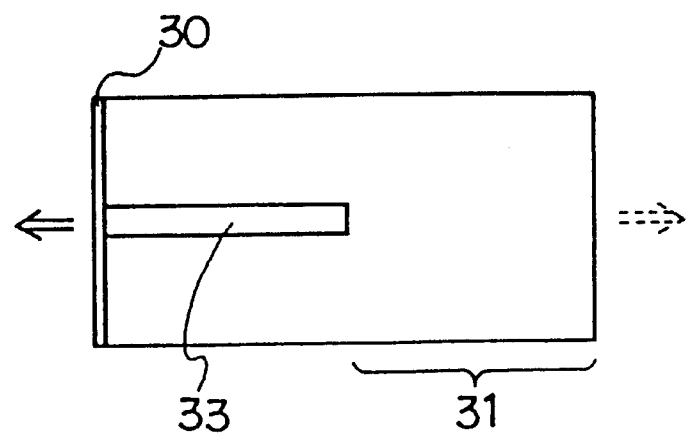
Figure 17:
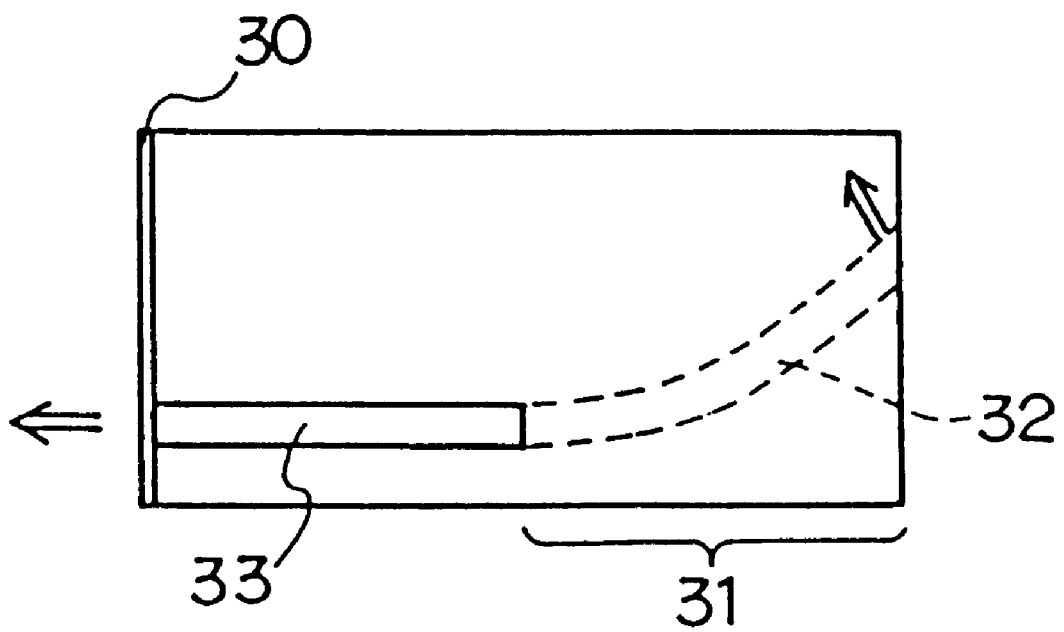

The SLD of this Example was manufactured in a manner similar to that shown in Example 1. However, the mask as shown in FIG. 13 was used as the mask for the formation of the current-injection regions 13a and 13b.

It should be understood that if only the cutting position is changed, the light output ratio of the front end face to the rear end face can be changed as desired.

Like Example 3, the arrangement such that two current-injection regions are disposed offset to each other is not limited to the structure of this Example and may be of another structure as far as the SLD is of current-blocking type.

As has been described, the SLD of the present invention has an non-excitation region which absorbs light effectively and, hence, such a region can be shortened, resulting in a downsized device, particularly in the length thereof. Since current is effectively injected to the current-injection region, incoherent light of a high intensity can be obtained with low current. Further, the current-injection region and the non-excitation region can be formed with only one masking step and with other steps unchanged, thus facilitating the production of SLDs. In addtion, since the active layer is formed on a planar substrate, it can be obtained as having good crystallinity even with vapor-phase epitaxy.

As a result, an SLD of good performance can be obtained without necessitating a special process.

By the provision of a recess in the current-noninjection region of a semiconductor substrate which lies between the current-injection regions, the terminal end portions of the active layer and the current blocking layer of the non-excitation region (the current-noninjection region) are aligned on the same level, allowing the non-excitation region to absorb light effectively.

Further, by employing the structure allowing even the rear end face to emit light, the intensity of light emitted can always be determined by monitoring light from the rear end face. In addition, the stripe-shaped groove does not fail to terminate at the light-emitting end face without requiring so high a precision in positioning the mask for forming the stripe-shaped groove. This will contribute to easy manufacturing with reduced costs.

Yet, since the current-blocking layer serving to absorb light is provided in the upper cladding layer in such a fashion as to split the current-injection region into two, FP mode oscillation can be restrained sufficiently. Besides, since the rear end face of the device can also emit light, the light emitted therefrom can be utilized for APC operation.

Further, by making the first and second current-injection stripe-shaped grooves serve as independent waveguides, the end face which is not intended to output light is used as the non-excitation region. For that reason, FP mode oscillation can be restrained sufficiently, while the light needed for the APC operation can be obtained from the rear end face of the device.

In the method of the present invention, current-injection regions are formed using a mask having stripe-shaped groove arranged lengthwise and crosswise or of a staggered arrangement, and the wafer is cut into chips so that each chip would include the front portion of one of two adjacent current-injection regions and the rear portion of the other. Therefore, a precision is not required so high for the cutting position and, hence, the method of the present invention offers a high mass productivity. If the current-injection regions extending respectively from the front and rear end faces of the device are made to have the same length, great care need not be taken with respect to the orientation of the chip when it is to be mounted with an automatic mounting apparatus. This allows an easy mounting operation. Furthermore, the current-injection region and the non-excitation region can be formed with one masking step and with other steps unchanged, thus assuring easy manufacturing.

Though several embodiments of the present invention are described above, it is to be understood that the present invention is not limited only to the above-mentioned, various changes and modifications may be made in the invention without departing from the spirit and scope thereof.

What is claimed is:

1. A superluminescent diode comprising:
   a semiconductor substrate of a first conductivity type;
   a lower cladding layer of the first conductivity type provided on a whole surface of said semiconductor substrate;
   an active layer provided on a whole surface of said lower cladding layer;
   a first upper cladding layer of a second conductivity type opposite to said first conductivity type provided on said active layer;
   a current blocking layer of the first conductivity type provided on said first upper cladding layer, two stripe-shaped grooves formed only in said current blocking layer and serving as current-injection regions, said current-injection regions extend from opposite end faces of a chip to an inside of said chip, and each current-injection region has a length shorter than that of said chip and a region formed between the current-injection regions serving as a current non-injection region; and
   a second upper cladding layer of said second conductivity type provided on said current blocking layer and provided in said grooves, a second upper cladding layer of said second conductivity type provided on said current blocking layer and provided in said grooves, wherein the active layer, in an area associated with the current-injection regions, and the current blocking layer, in an area associated with the current-noninjection region, are aligned on substantially a same level.

2. The superluminescent diode of claim 1, said end face of said chip is covered with low-reflectance coating film, and incoherent light is emitted from said end face.

3. The superluminescent diode of claim 1, wherein said lower cladding layer and said first and second upper cladding layers are each made of a material having a band gap energy larger than that of said active layer and a refractive index smaller than that of said active layer.

4. The superluminescent diode of claim 1, wherein said semiconductor substrate as a recess in said current-noninjection region formed by said current blocking layer.

5. The superluminescent of claim 4, wherein said recess in said current-noninjection region is formed in a manner that a height of said active layer in said current-noninjection region from an underside of said semiconductor substrate is substantially the same as a height of said current blocking layer in said current-noninjection region.

6. The superluminescent diode of claim 4, wherein opposite ends of said current-noninjection region are exposed at said opposite end faces, respectively, of the diode, and said current-noninjection region is located half way of said current-injection region.

7. The superluminescent diode of claim 4, wherein said current-noninjection region comprises a plurality of recesses.

8. A current-blocking type superluminescent diode of a compound semiconductor wherein an active layer is sandwiched by an upper cladding layer of a first conductivity type and a lower cladding layer of a second conductivity type, each having a band gap energy larger than that of the active layer and a refractive index smaller than that of the active layer, the superluminescent diode comprising:

two current-injection regions each of a stripe groove shape which are provided on opposite end faces, respectively, of a chip;

at least one current-noninjection region extended from a terminal end of each of said current-injection regions; and a current blocking layer formed inside said upper cladding layer, wherein said active layer provided on a whole surface of said diode and said active layer, in an area associated with said current-injection regions, and said current blocking layer, in an area associated with said current-noninjection region, are aligned on substantially a same level.

9. The superluminescent diode of claim 8, wherein said two current-injection regions are formed in a manner that axes of each of said stripe groove shape of said two current-injection regions are aligned with each other, a region interposed between each terminal end of said two current-injection regions is said at least one current-noninjection region which is common to said two current-injection regions.

* * * * *